United States Patent
Jurisch

(10) Patent No.: US 8,462,004 B2
(45) Date of Patent: Jun. 11, 2013

(54) METHOD AND ARRANGEMENT FOR GENERATING AN ERROR SIGNAL

(75) Inventor: Andreas Jurisch, Schwante (DE)

(73) Assignee: Siemens Aktiengesellschaft, Munich (DE)

( * ) Notice: Subject to any disclaimer, the term of this patent is extended or adjusted under 35 U.S.C. 154(b) by 364 days.

(21) Appl. No.: 12/936,229

(22) PCT Filed: Apr. 3, 2008

(86) PCT No.: PCT/EP2008/002752
§ 371 (c)(1),
(2), (4) Date: Dec. 16, 2010

(87) PCT Pub. No.: WO2009/121382
PCT Pub. Date: Oct. 8, 2009

(65) Prior Publication Data
US 2011/0109465 A1    May 12, 2011

(51) Int. Cl.
*G08B 21/00* (2006.01)
(52) U.S. Cl.
USPC .............................. 340/635; 361/42; 324/509
(58) Field of Classification Search
USPC ............. 340/635, 636.17, 650, 649; 324/500, 324/508, 509; 361/42, 107
See application file for complete search history.

(56) References Cited

U.S. PATENT DOCUMENTS

| 3,750,004 | A  | * | 7/1973  | Walker ............................ 363/58 |
| 7,894,169 | B2 | * | 2/2011  | Valdez et al. ................... 361/47 |
| 8,213,144 | B2 |   | 7/2012  | Papallo et al. |
| 8,335,062 | B2 | * | 12/2012 | Haines et al. ................... 361/42 |
| 8,339,755 | B2 | * | 12/2012 | Joshi ............................... 361/42 |
| 2008/0084215 | A1 | * | 4/2008 | Itten et al. ....................... 324/510 |
| 2011/0098951 | A1 | * | 4/2011 | Jurisch ............................ 702/58 |

FOREIGN PATENT DOCUMENTS

| CN | 1447124 A  | 10/2003 |
| CN | 1639938 A  | 7/2005  |
| EP | 0933643 A1 | 8/1999  |
| WO | 03073182 A1 | 9/2003 |

\* cited by examiner

*Primary Examiner* — George Bugg
*Assistant Examiner* — Edny Labbees
(74) *Attorney, Agent, or Firm* — Laurence A. Greenberg; Werner H. Stemer; Ralph E. Locher

(57) ABSTRACT

A method generates an error signal indicating the location of a ground fault in a line between two line ends. A voltage and a current are measured at both ends of the line, establishing measured values, and the location of the ground fault is determined when or after a ground fault is detected. Accordingly, harmonic indicator variables are established and used for determining the location of the ground fault.

16 Claims, 11 Drawing Sheets

METHOD AND ARRANGEMENT FOR GENERATING AN ERROR SIGNAL

BACKGROUND OF THE INVENTION

Field of the Invention

The invention relates to an arrangement and to a method for producing a fault signal which identifies the location of a ground fault on a line between two line ends wherein, in the method, the voltage and the current are measured at each of the two line ends, with measured values being formed, and, after or on detection of a ground fault, the location of the ground fault is determined. A method such as this makes it possible, for example, to detect and locate ground faults in power supply systems with an isolated star point or with resonant star point grounding.

Ground faults in power supply systems with an isolated star point or with resonant start point grounding lead to a voltage increase throughout that part of the power supply system which is decoupled via transformers. The location of ground faults always results in difficulties and leads to time-consuming search switching operations since the ground fault identification methods which have been used until now do not always operate selectively.

Previous methods for ground fault location use appliances which use the principle of wattmetric ground fault detection, harmonic methods or transient ground-fault relays.

Appliances using the principle of wattmetric ground fault detection determine the complex vectors of the zero phase-sequence system variables of the current and voltage of the fundamental frequency. The real power and reactive power of the zero phase-sequence system variables are determined from these variables. The real component of this signal indicates the direction of the ground fault, as seen from the relay installation location. The determined direction signals must be transported from the appliances to a central evaluation point using remote control technology or a control or protection system. The line affected by the ground fault can be determined there by manual or program-based evaluation. The principle of wattmetric ground fault detection is dependent on very accurate transformers with small angle errors. Normally, cable-type current transformers must be adjusted during the setting up procedure in order to meet the stringent accuracy requirements of the method. Since the transformer angle errors to be corrected are dependent on the transformer drive level, this adjustment is susceptible to errors, and can lead to unreliable indications.

The following two variants of the principle of transient ground-fault relays are known: In the first variant, the mathematical scientific sign of the first half-cycle of the transient process of the ground fault is evaluated. However, this first variant works only very close to the voltage maximum when a ground fault occurs suddenly. In the second variant, also referred to as the qu method, the displacement current is calculated from the instantaneous values of the voltage and the zero phase-sequence capacitance of the line to be investigated, and a Lissajou figure is formed using the measured zero phase-sequence current. The rise in this curve makes it possible to determine the ground fault direction.

In the case of the harmonic method, harmonics are applied artificially via a transformer star point, and these applied harmonics are used for ground fault location. Because the harmonics are feeding actively, additional primary technology is required in the power supply system. Only the direction of the ground fault can be determined by this method.

BRIEF SUMMARY OF THE INVENTION

The invention is based on the object of specifying a reliable method for ground fault location.

The invention accordingly provides that the harmonic component contained in the zero phase-sequence voltage or the zero phase-sequence current, as well as its decay time constant is determined for each of the two line ends, using the measured values, the magnitude and phase of a harmonic vector measurement variable are in each case formed using the harmonic component and the decay constant for each line end, wherein the time reference point of the phase of the harmonic vector measurement variable relates to the time of the ground fault detection at the respective line end, the harmonic vector measurement variables formed in this way are rotated, starting from their respective line end, to a time in the past, and the time in the past and the point on the line at which the rotated-back harmonic vector measurement variables have at least approximately the same magnitude and at least approximately the same phase are determined, and the location determined in this way is regarded as the location of the ground fault, and is output with the fault signal.

One major advantage of the method according to the invention is that harmonics are evaluated in this method, thus allowing very accurate fault location. In addition, the transformers that are used are subject only to minor measurement accuracy requirements, since the location of a ground fault when using the method according to the invention can be determined very accurately even using transformers which have not been specifically adjusted.

A further major advantage of the method according to the invention is that this method—in contrast to the already known methods described initially—operates reliably even with so-called transient ground faults. With the already known methods, the process of locating transient ground faults does not always operate reliably, since transient ground faults are present only at times.

A third major advantage of the method according to the invention is that the voltage can be measured without synchronization at the two line ends, and the voltage measured values at the two line ends can be unsynchronized.

According to one preferred refinement of the method, taking account of the telegraph equation, which describes the propagation of electromagnetic waves on lines, a first and a second zero phase-sequence voltage vector are calculated for a selectable point on the line, for a time which is located in the past corresponding to the propagation time to the selectable location, using the harmonic vector measurement variables of zero phase-sequence current and zero phase-sequence voltage at the two line ends, wherein the first zero phase-sequence voltage vector is calculated starting from the first line end in the direction of the second line end, and the second zero phase-sequence voltage vector is calculated starting from the second line end in the direction of the first line end, the two zero phase-sequence voltage vectors calculated in this way are compared with one another, and that location is selected at which the calculated zero phase-sequence voltage vectors best match, and the line location determined in this way is regarded as the location of the ground fault. Location is possible very easily and quickly by means of the telegraph equation.

According to a further preferred refinement of the method, the magnitude and phase of the two harmonic vector measurement variables are in each case determined by means of an estimation method on the basis of a predetermined signal model, which models the time profile of the zero phase-sequence voltage in the case of a ground fault, wherein the predetermined signal model takes account at least of the harmonic vector measurement variable to be determined at a defined vector angular frequency, the determined decay time constant of the harmonic component and a zero phase-sequence voltage vector measurement variable at the fundamental frequency of the zero phase-sequence voltage, and wherein, during the course of the estimation method, the magnitude and the phase of the harmonic vector measurement variable are adapted such that the discrepancy between the time signal profile of the modeled signal of the signal model and the measured time signal profile of the measured values of the zero phase-sequence voltage is a minimum. A least squares estimation method, a Kalman filter algorithm or an ARMAX estimation method is preferably used as the estimation method.

In addition, it is considered to be advantageous if a frequency which is dominant for the harmonic component is selected from the frequency spectrum of the harmonic component, and the vector angular frequency of the two harmonic vector measurement variables is in each case defined such that it corresponds to the dominant frequency. By way of example, that harmonic frequency whose amplitude is a maximum can be determined in the harmonic component, and this is defined as the vector angular frequency.

The time window for the data used to determine the harmonic vector measurement variables is preferably determined such that the time window start is fixed at the start of the rise of the zero phase-sequence voltage after a predetermined threshold value has been exceeded.

The harmonic component is preferably determined in that a measurement window for which the frequency spectrum of the zero phase-sequence voltage is determined by means of a Fourier transformation is in each case opened for each line end after the detection of the ground fault, and the frequency spectrum is subjected to high-pass filtering, in which the harmonics of the fundamental frequency of the zero phase-sequence voltage are separated, forming the harmonic component.

The decay constant can be determined particularly easily and therefore advantageously in that the root mean square value of the harmonic component is determined and the decay time constant of the root mean square value is determined, and the determined decay time constant of the root mean square value is regarded as the decay time constant of the harmonic component.

In order to minimize the hardware complexity, it is considered to be advantageous if in the method, the measurement of the voltage and the current at the two line ends is carried out free of synchronization, and the voltage and current measured values at the two line ends are unsynchronized.

The invention also relates to an arrangement for producing a fault signal, which identifies the location of a ground fault on a line between a first and a second line end, wherein the arrangement has: a first measurement instrument at the first line end of the line and a second measurement instrument at the second line end of the line.

According to the invention, an evaluation device, which is connected to the two measurement instruments and is suitable for using the measured values from the two measurement instruments to carry out a method as described above, is present.

By way of example, the evaluation device may be formed by a programmed data processing installation.

The evaluation device can be arranged in a central device, to which the two measurement instruments are connected. Alternatively, the two measurement instruments can be connected to one another, with the evaluation device being implemented in one of the measurement instruments.

The invention also relates to a field device, in particular a protective device, for connection to one line end of an electrical line and for identification of a ground fault on the line. According to the invention, the field device has: an evaluation device which is suitable for carrying out a method as described above, as well as a data connection for connection to another measurement instrument for receiving measured values which relate to the other line end of the line.

The invention will be explained in more detail in the following text with reference to exemplary embodiments. In this case, by way of example, in the figures:

DESCRIPTION OF THE INVENTION

For the sake of clarity, the same reference signs are always used for identical or comparable components in the figures.

Figure 1:
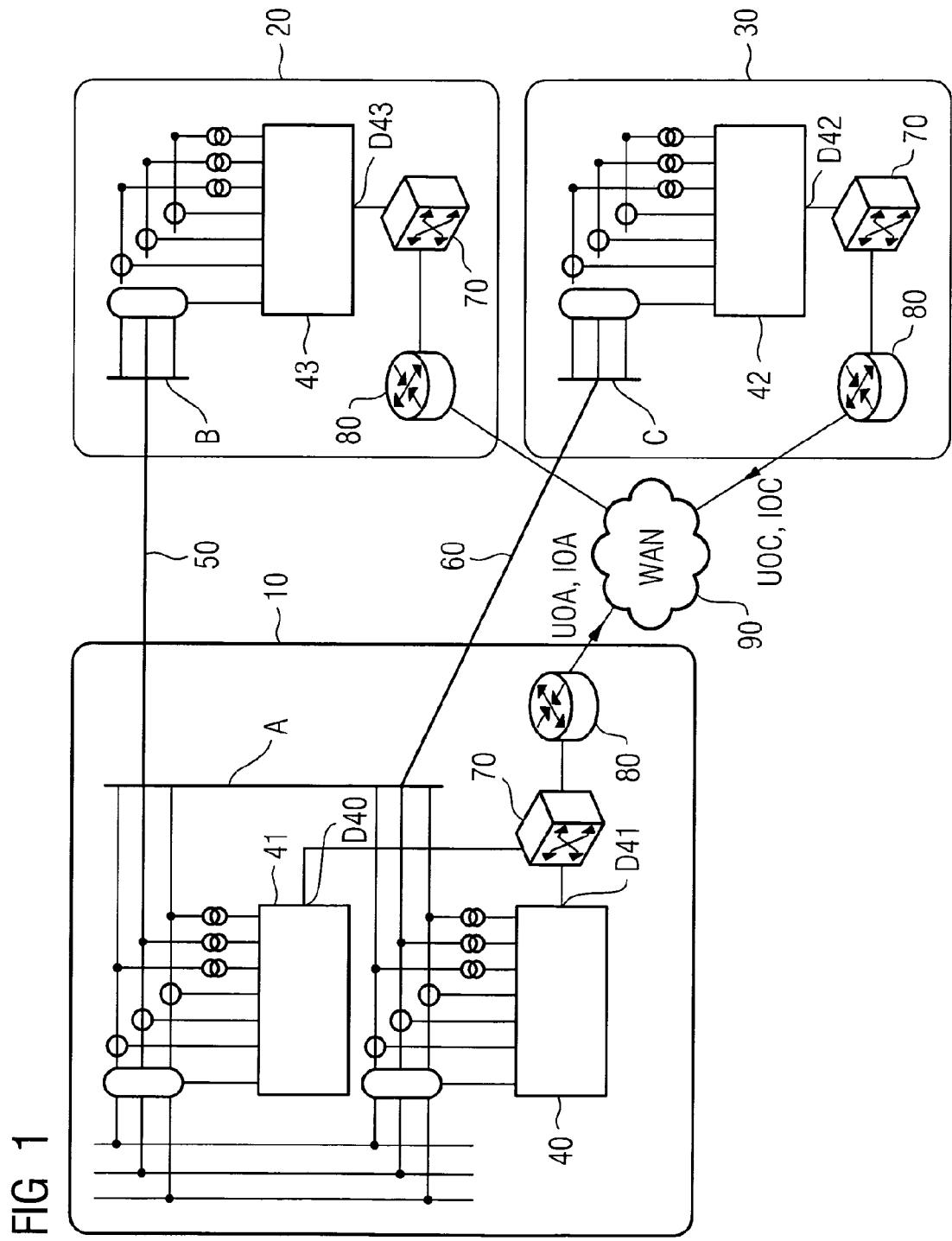
FIG. 1 shows an arrangement with three field devices.

FIG. 1 shows an electrical arrangement which has three substations 10, 20 and 30. The substation 10 contains two field devices 40 and 41, and the substations 20 and 30 each contain one field device. The four field devices 40, 41, 42 and 43 may, for example, be physically identical, but this is not essential.

The connection point A of the substation 10 and connection point B of the substation 20 are connected to one another by means, for example, of a three-phase power transmission line 50; the connection point A of the substation 10 and the connection point C of the substation 30 are connected to one another by means, for example, of a three-phase power transmission line 60.

The field devices are connected via their data connection D40, D41, D42 and D43 to local power supply systems 70, routers 80 and to a WAN 90 (WAN: wide area network), for example the Internet, and therefore also have a data link between them, for example based on ETHERNET Standard, using fixed predetermined IP addresses for each of the field devices.

By way of example, the field device 40 in the substation 10 can interchange data via this data link with the field device 42 in the substation 30, for example in each case the measured values of the current and voltage at the respective connection points A and C and/or measured values derived therefrom, for example the magnitude and phase of harmonic vector measurement variables. For example, harmonic vector measurement variables U0A and I0A can thus be transmitted from the field device 40 to the field device 42, and harmonic vector measurement variables U0C and I0C can be transmitted from the field device 42 to the field device 40.

Figure 2:
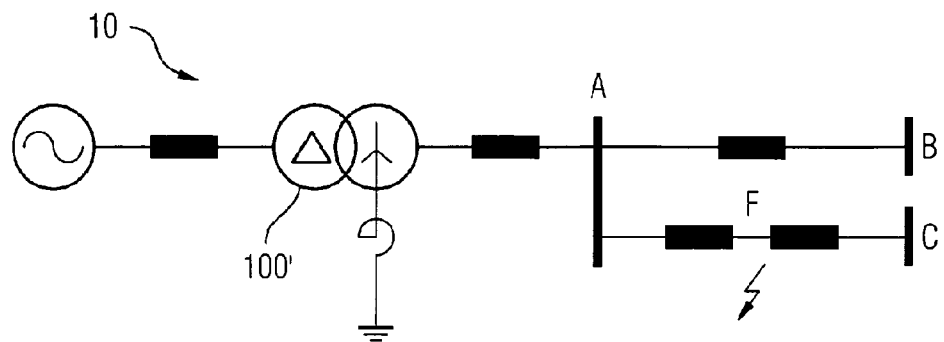
FIG. 2 shows the electrical equivalent circuit of the arrangement shown in FIG. 1, FIGS. 3, 4 show simplified electrical equivalent circuits of the arrangement shown in FIG. 1.
Figure 3:
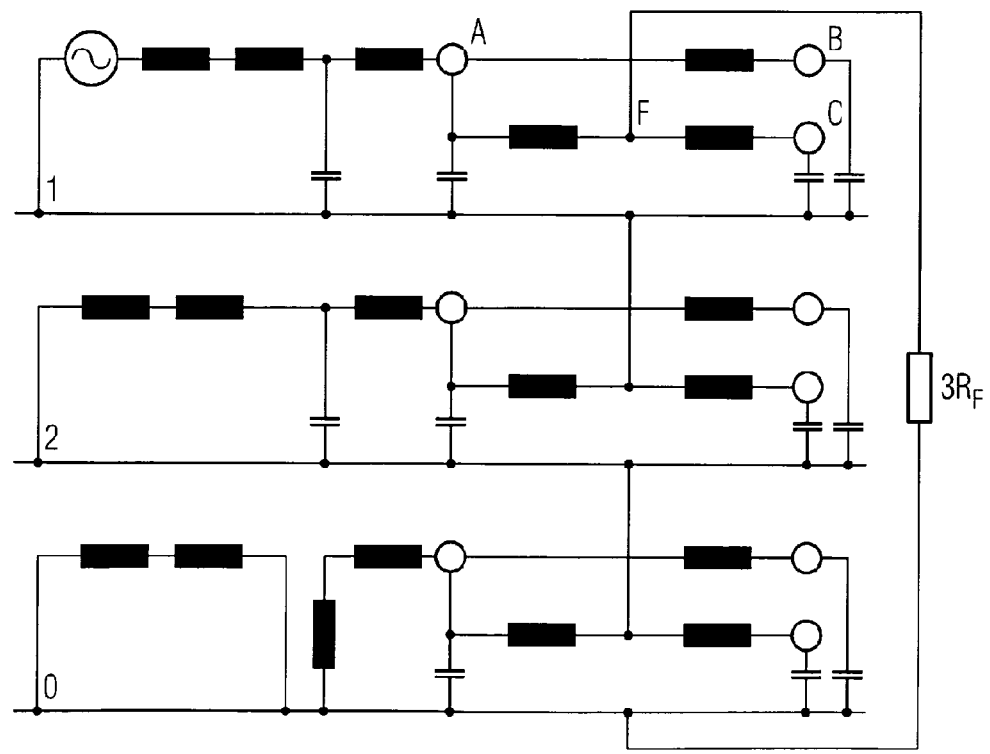
Figure 4:
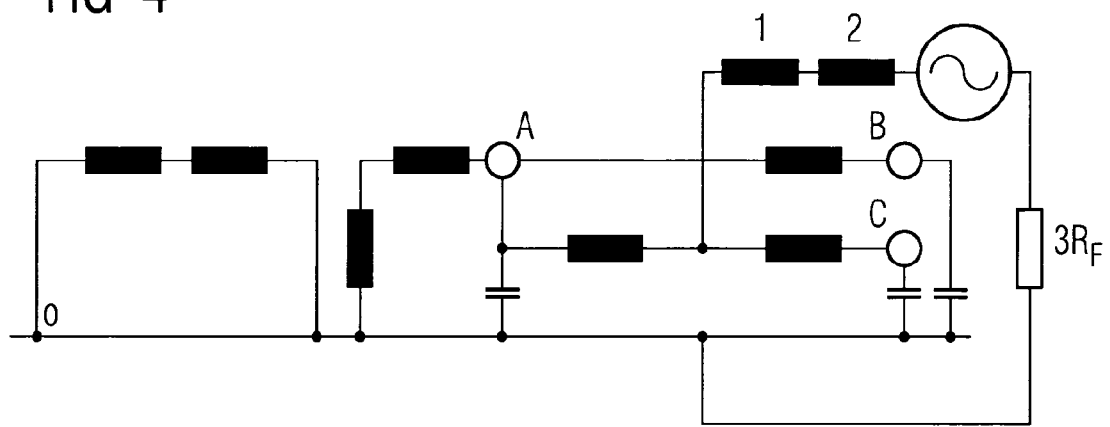

By way of example, FIGS. 2 and 3 show simplified electrical equivalent circuits of the arrangement shown in FIG. 1. As can be seen, the part of the power supply system to the right of a transformer 100 in the substation 10 is provided with resonant star point grounding. If an equivalent resistance and an equivalent voltage source are formed for the positive and negative phase-sequence systems in this part of the power supply system, this results in a simplified equivalent circuit, which is shown in FIG. 4.

Figure 14:
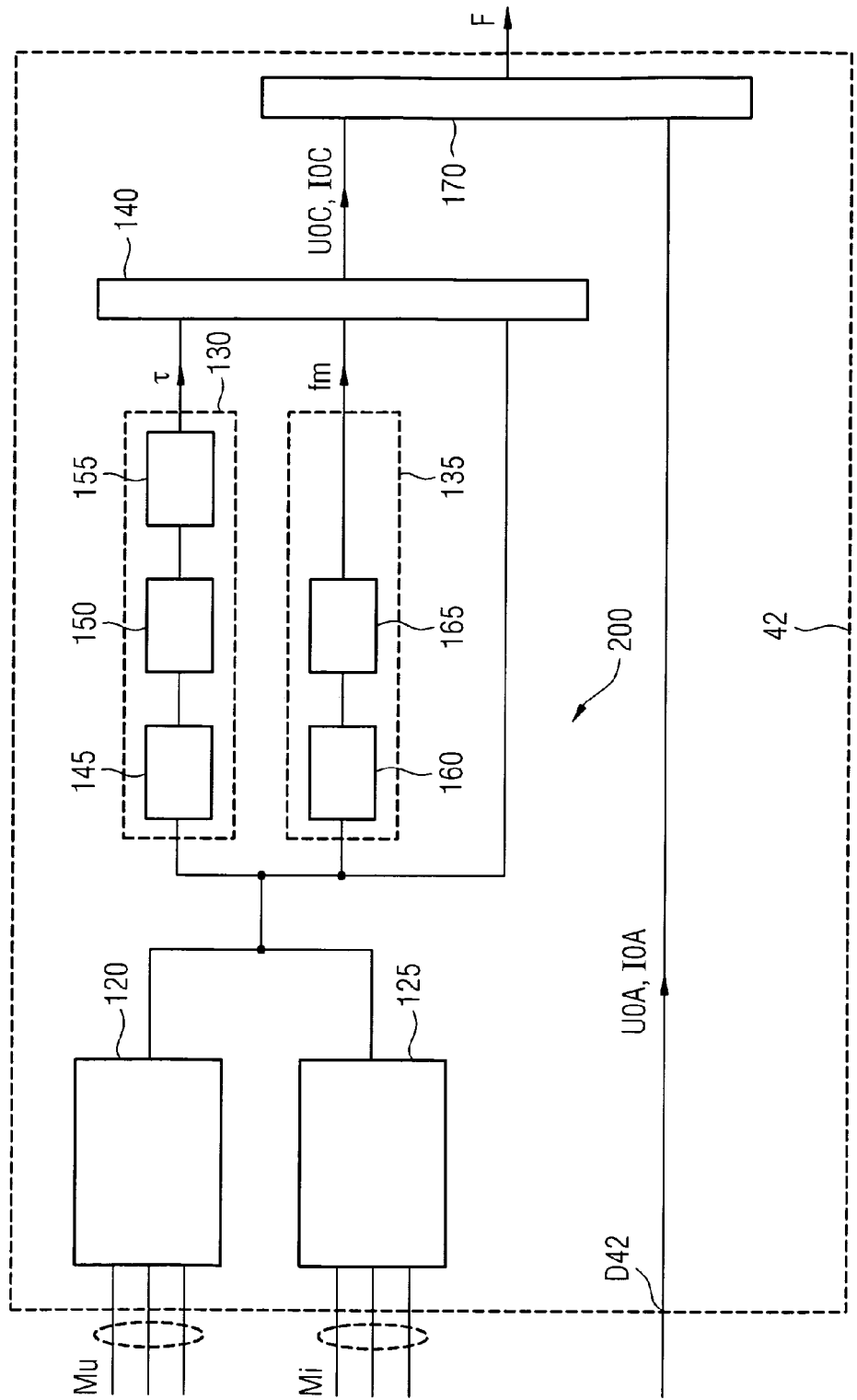
FIG. 14 shows one exemplary embodiment of a field device according to the invention.

FIG. 14 shows an exemplary embodiment of the field device 42. The field devices 40, 41 and 43 from FIG. 1 may be designed to be identical or similar.

FIG. 14 shows a zero phase-sequence voltage forming means 120 and a zero phase-sequence current forming means 125, which are connected on the input side to the connection point C of the substation 30, and receive current measured values Mi and voltage measured values Mu. The zero phase-sequence voltage forming means 120 and the zero phase-sequence current forming means 125 are followed by a device 130 for determining a decay constant τ, a device 135 for defining a harmonic frequency fm, and an estimation device 140.

The device 130 for determining the decay constant τ comprises a high-pass filter 145, a root mean square value forming means 150 and a time constant determining means 155.

The device 135 for defining the harmonic frequency fm comprises an FFT device (FFT: Fast Fourier Transformation) 160 and a maximum-value searching means 165.

The outputs of the devices 130 and 135 are connected to further inputs of the estimation device 140. On the output side, the estimation device 140 is connected to a fault location determining device 170, whose input side is also connected to the data connection D42.

By way of example, the field device 42 can be operated as follows:

First of all, the zero phase-sequence voltage forming means 120 and the zero phase-sequence current forming means 125 form zero phase-sequence voltage values and zero phase-sequence current values.

The device 130 for determining the decay constant uses its high-pass filter 145 to filter the harmonic component out of the zero phase-sequence voltage, and uses the root mean square value forming means 150 to form a root mean square value of the harmonic component. The time constant determining means 155 uses the time profile of the root mean square value of the harmonic component to determine the rate of decay of the root mean square value, forming the decay constant τ, which is passed to the estimation device 140.

The maximum-value searching means 165 in the device 135 searches for a dominant frequency fm in the voltage frequency spectrum formed by the FFT device 160, and passes this to the estimation device 140. For example, the maximum-value searching means 165 will determine in the harmonic component that harmonic frequency whose amplitude is a maximum, and will output this frequency as the dominant frequency fm.

A signal model which models the time profile of the zero phase-sequence voltage in the event of a ground fault is stored in the estimation device 140. The signal model takes account, as influencing parameters which determine the signal profile, of a harmonic vector measurement variable at the dominant frequency fm, the decay constant τ and a zero phase-sequence voltage vector measurement variable at the fundamental frequency of the zero phase-sequence voltage. The estimation device 140 uses a predetermined estimation method and this signal model to adapt the magnitude and the phase of the harmonic vector measurement variable such that and until the discrepancy between the time signal profile of the modeled signal from the signal model and the measured time signal profile of the measured values of the zero phase-sequence voltage is a minimum. In this way, the magnitude and phase for the voltage, and in the corresponding manner for the current, are formed on the output side for a harmonic vector measurement variable, by means of the harmonic component and the decay constant τ, in which case the time reference point of the phase of the harmonic vector measurement variable relates to the time of ground fault detection at the respective line end. The harmonic vector measurement variables for the current and voltage are identified by the reference signs U0C and I0C.

The harmonic vector measurement variables U0C and I0C as well as the harmonic vector measurement variables U0A and I0A are passed to the fault location determining device 170 which mathematically rotates the harmonic vector measurement variables, which have been formed in the described manner, to a time in the past, starting from their respective line ends A and C, and determines the time in the past and the point on the line 60 at which the two rotated-back harmonic vector measurement variables U0C and U0A as well as the two rotated-back harmonic vector measurement variables I0A and I0C have at least approximately the same magnitude and at least approximately the same phase. The location determined in this way is regarded as the location of the ground fault, and is output with the fault signal F.

The mathematical backward rotation of the harmonic vector measurement variables may be carried out, for example, taking account of the telegraph equation which describes the propagation of electromagnetic waves on lines. In this case, the magnitude and the phase of the harmonic vector measurement variable of the zero phase-sequence voltage for a selectable location are calculated for a time in the past around the propagation time with respect to the selectable location from the harmonic vector measurement variables of the zero phase-sequence current and zero phase-sequence voltage of that respective line end in the direction of the other line end. The zero phase-sequence voltage vectors calculated in this way—starting from each of the two conductor ends—are compared with one another, and that location is selected at which the calculated vectors best match.

The components 120, 125, 130, 135, 140 and 170 of the field device 42 form an evaluation device 200; by way of example, this may be formed by a data processing installation.

Figure 5:
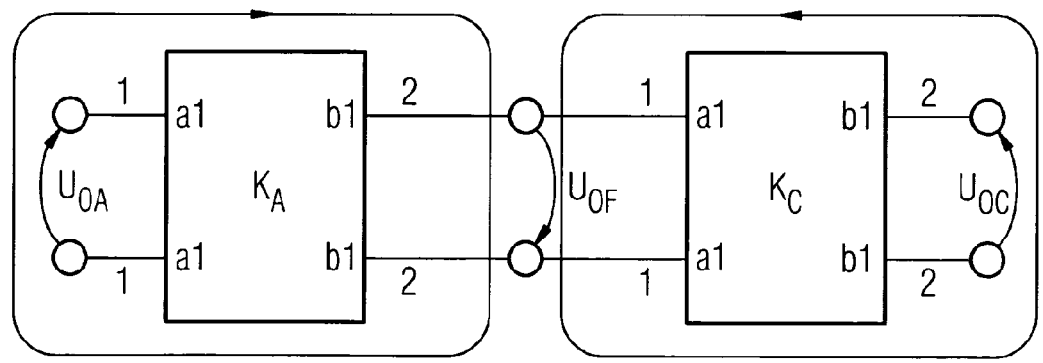
FIG. 5 shows an electrical equivalent circuit of a power transmission line with a ground fault.

The procedure described above for determining the fault location may, for example, appear as follows in detail:

If it is assumed that the measured values of the zero phase-sequence system voltage and zero phase-sequence system current for the power supply system nodes A and C are available, an equivalent circuit of the zero phase-sequence system can be created for a line with a fault, as is illustrated in FIG. 5.

FIG. 5 shows two networks which, at the fault location F, contain a common voltage for the voltage in the zero phase-sequence system at the fault location U0F. The two four-pole networks KA and KC represent the line model of the zero phase-sequence system from the line ends of the nodes A and C, respectively, to the fault location F. The following equation describes the linking matrix for the four-pole networks:

$$\begin{pmatrix} U_2 \\ I_2 \end{pmatrix} = \begin{pmatrix} k_{11} & k_{12} \\ k_{21} & k_{22} \end{pmatrix} \cdot \begin{pmatrix} U_1 \\ I_1 \end{pmatrix}$$

where $$K = \begin{pmatrix} \cosh(\gamma(j\omega) \cdot l) & Z_W(j\omega) \cdot \sinh(\gamma(j\omega) \cdot l) \\ \frac{1}{Z_W(j\omega)} \cdot \sinh(\gamma(j\omega) \cdot l) & \cosh(\gamma(j\omega) \cdot l) \end{pmatrix}$$

and $$Z_W(j\omega) = \sqrt{\frac{R' + i\omega \cdot L'}{G' + i\omega \cdot C'}}$$

$$\gamma(j\omega) = \sqrt{(R' + i\omega \cdot L') \cdot (G' + i\omega \cdot C')}$$

The variables R', L', G' and C' represent the kilometric variables of series resistance, series inductance, parallel conductance and parallel capacitance of the line. The two following equations can now be produced for the fault location.

$$U_{0rA} = U_{0rC} = U_{0F}$$

where $$U_{0F} = U_{0rA} = k_{11}(jW,l) \cdot U_{0A} + k_{12}(jw,l) \cdot I_{0A}$$

$$U_{0F} = U_{0rC} = k_{11}(jW, 1-l) \cdot U_{0C} + k_{12}(jw, 1-l) \cdot I_{0C}$$

The functions k can be assumed to be known as a function of the frequency for a given line length. The only unknown variable in the above equation system is therefore the distance 1 to the fault. This variable can be determined by direct solution of the stated equation, if the complex vectors are available for U0A, I0A, U0C and I0C.

The function described above can be converted to a non-linear optimization problem by creating a cost function. In this case, the parameters of the kilometric impedances can also be included in the vector of the variables to be optimized. The square of the model error of the voltage at the fault location can be used as a cost function:

$$e(l,jw,R',L',G',C') = (Re\{U_{0rA}\} - Re\{U_{0rC}\})^2 + (Im\{U_{0rA}\} - Im\{U_{0rC}\})^2$$

where $$U_{0rA} = k_{11}(jw,l) \cdot U_{0A} + k_{12}(jW,l) \cdot I_{0A}$$

$$U_{0rC} = k_{11}(jw, 1-l) \cdot U_{0C} + k_{12}(jw, 1-l) \cdot I_{0C}$$

The following optimization task is solved by using a non-linear optimization method, as is known by way of example from the document "A Fast Algorithm For Fast Nonlinearly Constrained Optimization Calculations" (Powell, M. J. D., Numerical Analysis, G. A. Watson ed., Lecture Notes in Mathematics, Springer Verlag, Vol. 630, 1978):

Min e(l,jw,R', L',G',C')
1
where
1∈[01]

In this case, vectors for the dominant transient frequency are used for the complex vectors U0A, I0A, U0C and I0C rather than the fundamental frequency vectors. By way of example, these can be determined as follows: In the zero phase-sequence system, the reactance of the Petersen coil which is located at the star point of the feeding transformer and the capacitance of the overall power supply system to ground results in a parallel resonant circuit, which is tuned to the power supply system frequency. With good adjustment, this signal provides a correlated component for the fundamental frequency vector and can therefore cause considerable measurement errors in vector determination. However, the series inductances in the power supply system, together with the capacitances to ground of the line, form further series and parallel resonant circuits which, in the event of a ground fault, lead to transient processes at their natural frequency, as a result of the discharging of the conductor affected by the ground-fault, and the charging of the conductors which are not affected.

Figure 6:
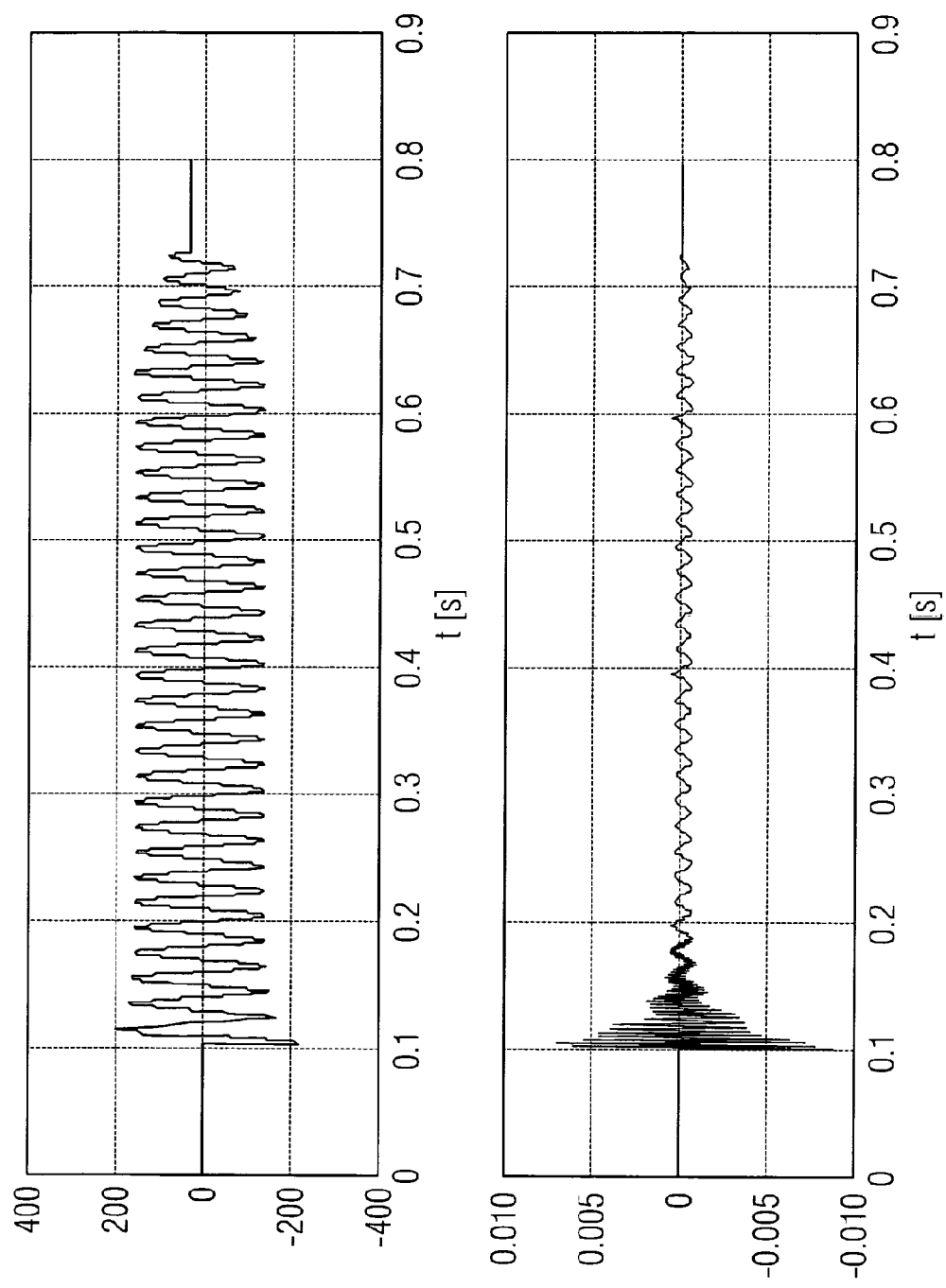
FIG. 6 shows a typical profile of the zero phase-sequence variables in the event of a ground fault.

FIG. 6 shows a typical profile of the zero phase-sequence current and voltage when a ground fault occurs. FIG. 6 clearly shows the transient process of the zero phase-sequence voltage (upper diagram) and of the zero phase-sequence current (lower diagram). As can be seen, the amplitude of the zero phase-sequence current during the transient process is several times the current amplitudes during the steady state.

Figure 7:
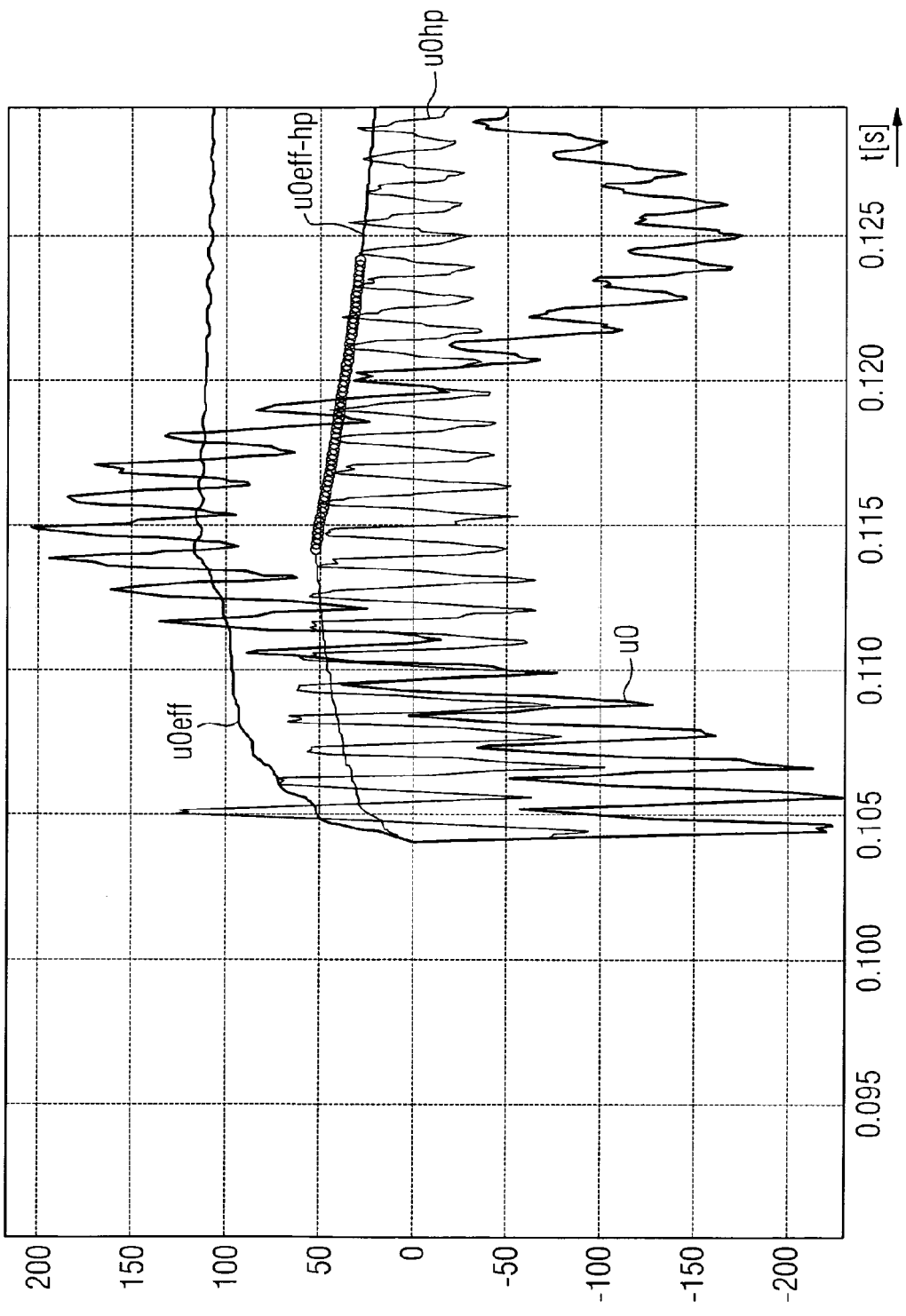
FIG. 7 shows signal processing steps for data window and time constant determination.

FIG. 7 shows a detail of the transient process of the voltage; in this case, u0 denotes the measured zero phase-sequence voltage, u0rms the root mean square value of the zero phase-sequence voltage, u0 hp the high-pass-filtered zero phase-sequence voltage and u0rms-hp the high-pass-filtered root mean square value of the zero phase-sequence voltage.

Figure 13:
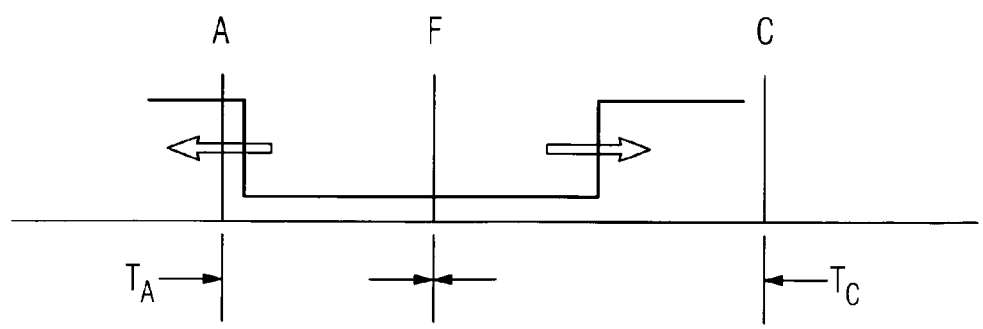
FIG. 13 shows, schematically, the propagation of a wave on a line.

By way of example, the overshooting of a u0 threshold value is used as the start value for determining the start of the data window. By way of example, pre-fault variables can be used in conjunction with a zero phase-sequence system model of the sound line to synchronize the data windows of the two line ends. Alternatively, the time difference between the data windows can also be included in the solution of the non-linear optimization. For this purpose, the propagation times of the wave from the fault location to the measurement locations can be taken into account, for example, as follows (cf. FIG. 13): the distance between the measurement locations and the fault location can be converted to a propagation time of the wave from the fault location to the measurement locations with the aid of the propagation time constant in the telegraph equation:

$$T_A = Im\{\gamma\} \cdot l$$

$$T_C = Im\{\gamma\} \cdot (1-l)$$

If the times of arrival of the wave at the measurement locations are now determined exactly from the start of the rise of the zero phase-sequence voltage, the time offset between these times with respect to the time at which the fault started can be indicated by TA at the measurement point A and by TC at the measurement point C. These time shifts can now be taken into account as follows:

$$e(l,jw,R'L'G'C') = (Re\{U_{0rA}\} - Re\{U_{0rC}\})^2 + (Im\{U_{0rA}\} - Im\{U_{0rC}\})^2$$

where $$U_{0rA} = k_{11}(jw,l) \cdot U_{0A} \cdot e^{-j\,Im\{\gamma\} \cdot l} + k_{12}(jw,l) \cdot I_{0A} \cdot e^{-j\,Im\{\gamma\} \cdot l}$$

$$U_{0rC} = k_{11}(jw, 1-l) \cdot U_{0C} \cdot e^{-j\,Im\{\gamma\} \cdot (1-l)} + k_{12}(jw, 1-l) \cdot I_{0C} \cdot e^{-j\,Im\{\gamma\} \cdot (1-l)}$$

The vectors of the complex vectors related to the start of the data window are rotated back to the time at which the fault started.

Figure 8:
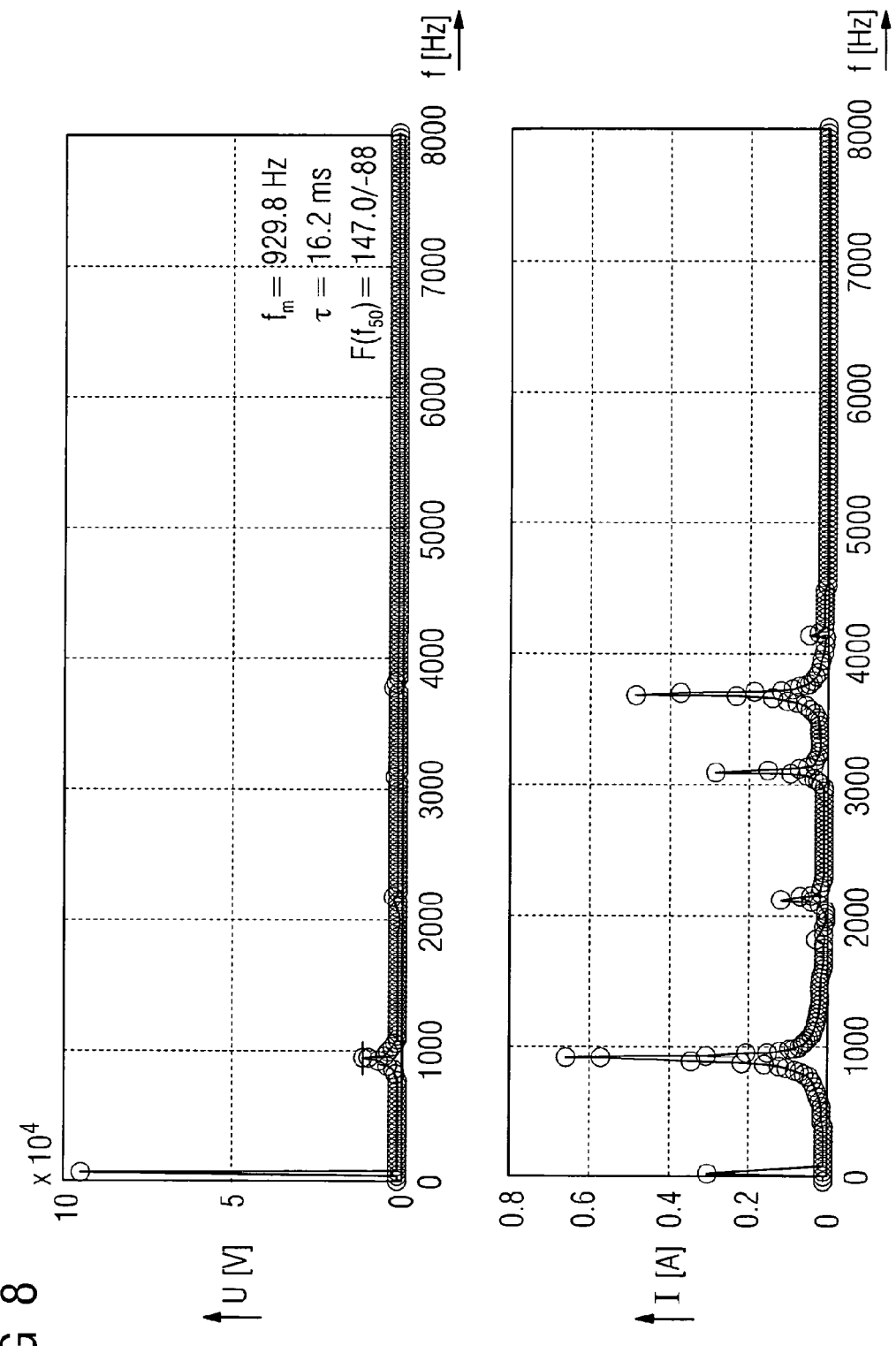
FIG. 8 shows a spectra of the zero phase-sequence current and zero phase-sequence voltage.

The fundamental frequency component can be eliminated by high-pass filtering. If this signal is subjected to a root mean square value formation, this results in a signal which is proportional to the envelope curve of the transient process. The time constant of the decaying exponential function can be determined by means of coefficient comparison from this signal:

$$\tau = \frac{t_2 - t_1}{\ln\left(\frac{f(t_1)}{f(t_2)}\right)}$$

where:
$f(t_1)$ envelope curve relating to the time $t_1$
$f(t_2)$ envelope curve relating to the time $t_2$ FIG. 8 shows the spectra of the zero phase-sequence current and zero phase-sequence voltage determined by means of an FFT (Fast Fourier Transformation). The maximum value is searched for in the area above the rated frequency from the spectrum of the voltage.

The mid-frequency can be determined by means of linear interpolation, using the symmetry of the leakage effect, from the sample values of the voltage spectrum calculated by means of FFT. The following least-squares estimator for the parameters of a signal model defined as follows using the signal parameters, which are now known, of the mid-frequency of the dominant harmonic fm and the decay time constant of the envelope curve can be established:

$$\delta = \begin{pmatrix} e^{-\frac{t_1}{\tau}} \cdot \sin(2\pi \cdot f_m \cdot t_1) & & e^{-\frac{t_N}{\tau}} \cdot \sin(2\pi \cdot f_m \cdot t_N) \\ e^{-\frac{t_1}{\tau}} \cdot \cos(2\pi \cdot f_m \cdot t_1) & & e^{-\frac{t_N}{\tau}} \cdot \cos(2\pi \cdot f_m \cdot t_N) \\ \sin(2\pi \cdot f_m \cdot t_1) & \ldots & \sin(2\pi \cdot f_m \cdot t_N) \\ \cos(2\pi \cdot f_m \cdot t_1) & & \cos(2\pi \cdot f_m \cdot t_N) \\ e^{-\frac{t_1}{\tau}} & & e^{-\frac{t_N}{\tau}} \end{pmatrix}$$

$k = \text{inv}(\delta \cdot \delta_T) \cdot \delta$ $\Theta = k \cdot I_0$ where $I_0 = (i_{0(1)} \ldots i_{0(N)})$ The estimator calculates an optimal filter k. In order to calculate the complex vector of the zero phase-sequence current or zero phase-sequence voltage, it is sufficient to calculate the first two elements of the parameter vector. These elements represent the real part and imaginary part of the complex vector of the dominant equalizing oscillation.

Figure 9:
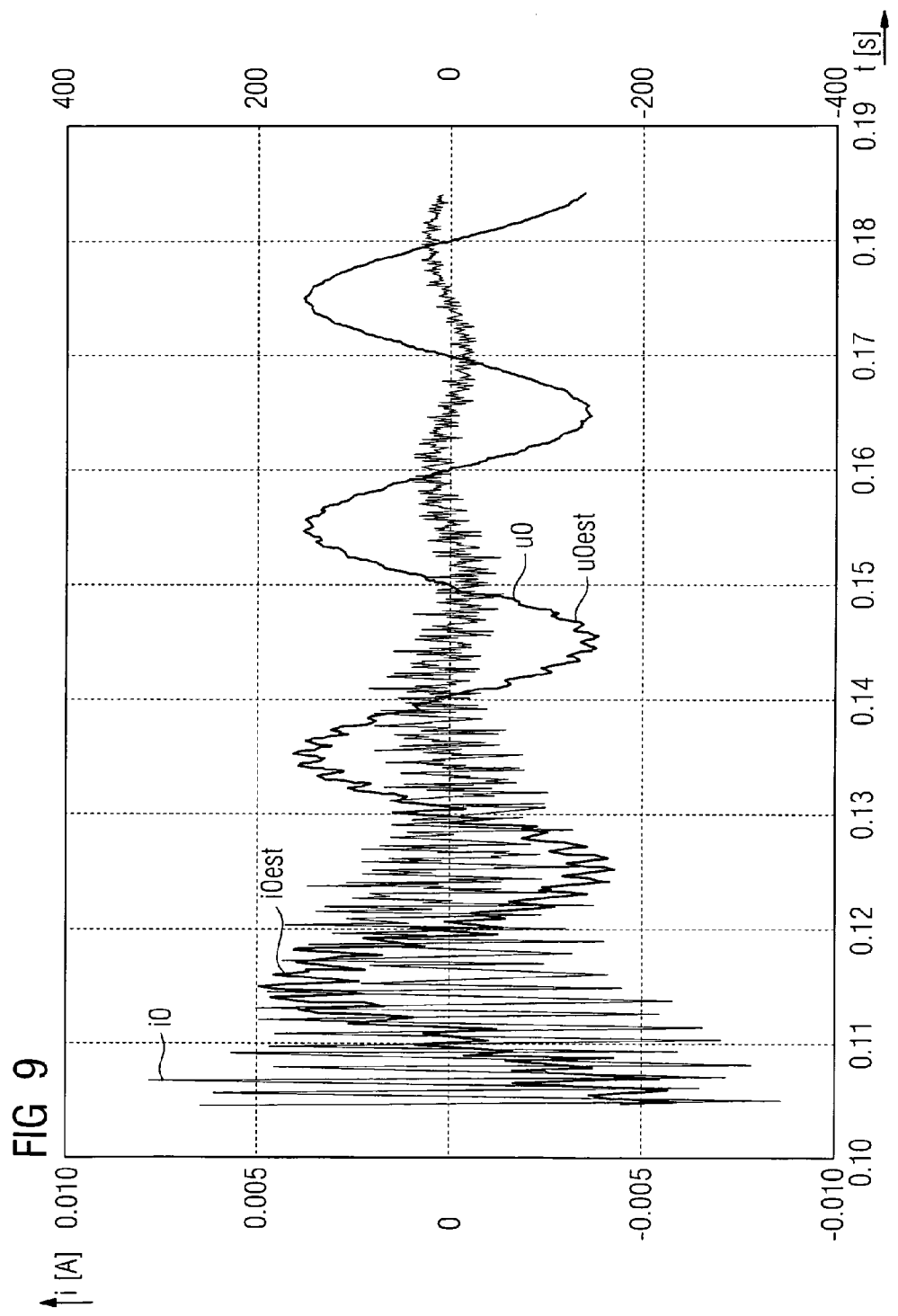
FIG. 9 shows the match between the measured and estimated signals (complete data window)
Figure 10:
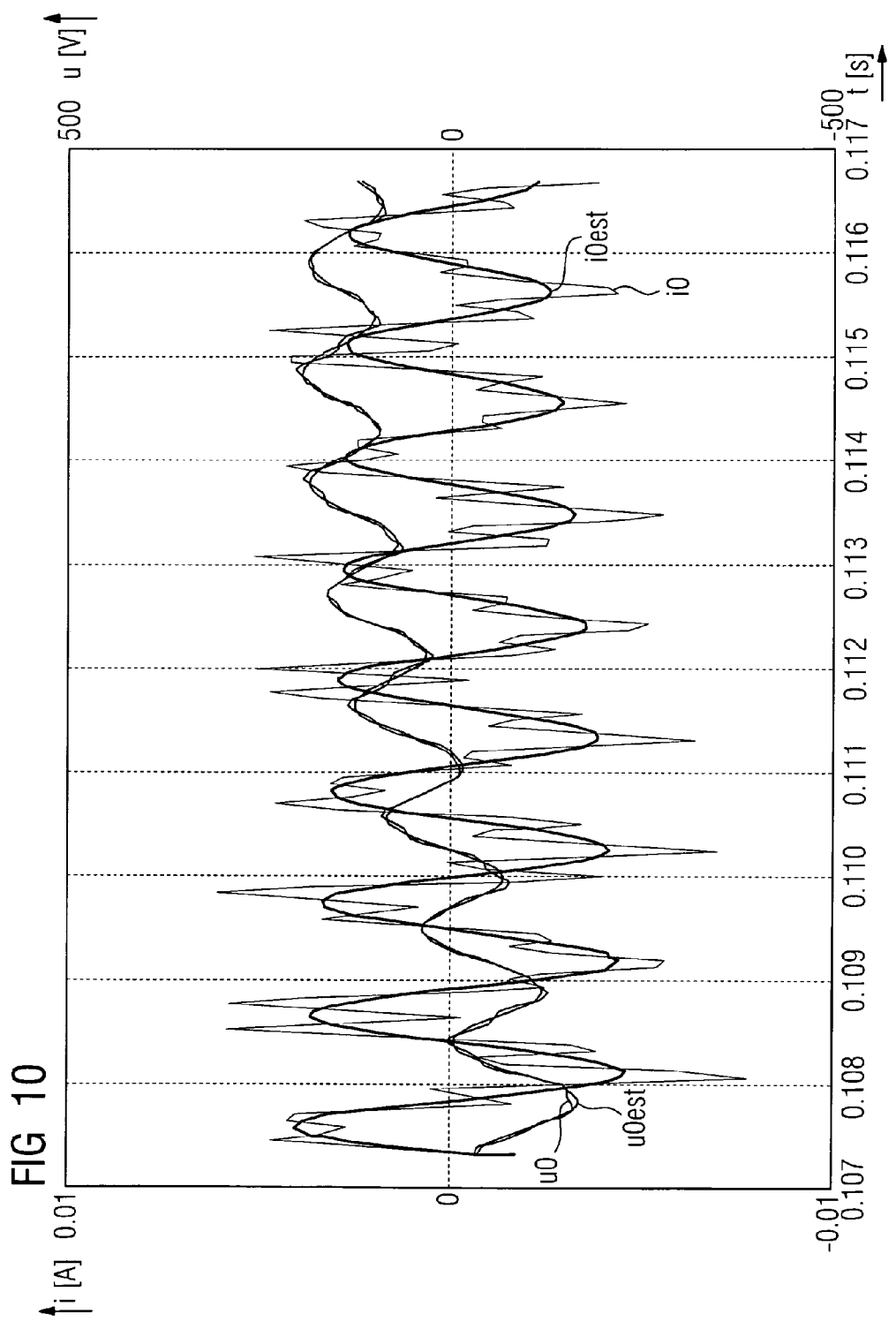
FIG. 10 shows the match between the measured and estimated signals (detail)

FIGS. 9 and 10 shows the approximation of the measured signal of the zero phase-sequence voltage u0 and zero phase-sequence current i0 by the estimated signal u0*est* and i0*est* (formed from the signal model of the estimator using the estimated parameters), in each case with a different time resolution: In this case, FIG. 9 shows the match between the measured and estimated signals in the complete data window, and FIG. 10 shows the match between the measured and estimated signals in a detail.

Figure 11:
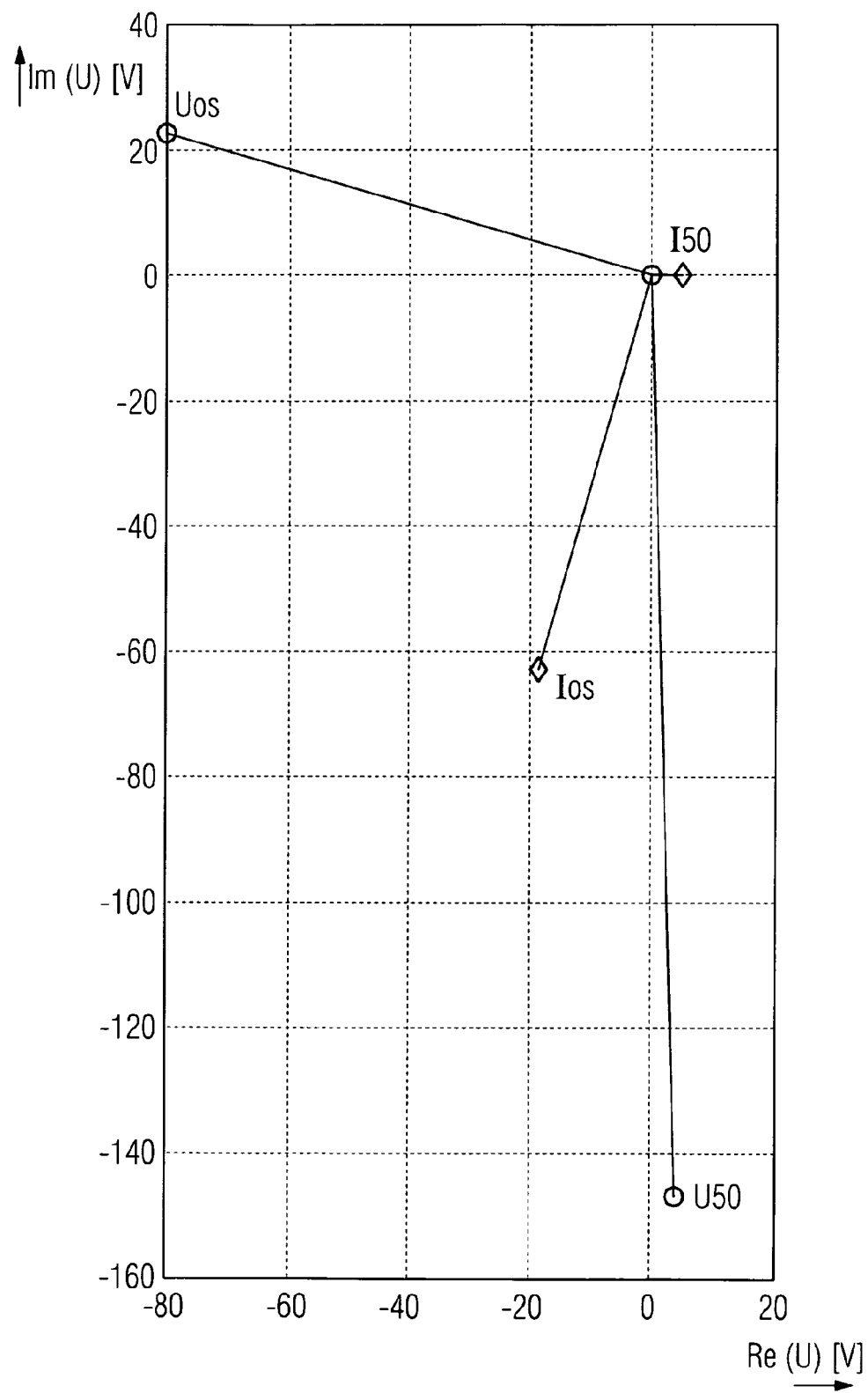
FIG. 11 shows calculated complex vectors.

FIG. 11 shows the complex vectors formed from the parameters. FIG. 11 clearly shows the magnitude ratios between the fundamental frequency vectors U50 and I50 and the vectors Uos and Ios of the dominant frequency fm of the transient process. The harmonic vectors Uos and Ios allow considerably more reliable direction determination and fault location, since the magnitude of the current vector Ios is considerably greater than the fundamental current vector I50.

Figure 12:
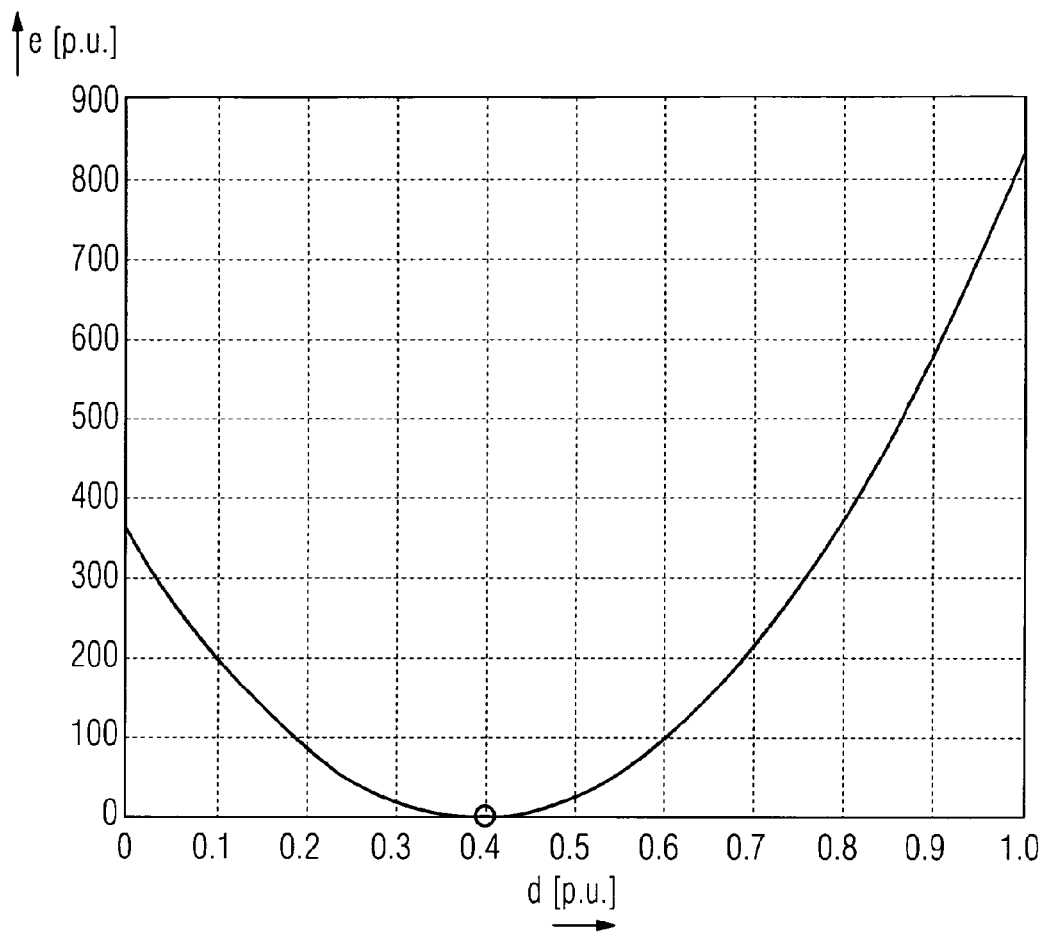
FIG. 12 shows the profile of a cost function.

By way of example, FIG. 12 shows the cost function $e(d) = (\Delta Uf)^2$ calculated using the vectors. The function shows the difference in the voltage of the fault location calculated using the complex vectors of the dominant transient frequency. When the fault distance corresponds to the fault, the fault voltage calculated from both ends matches, and the cost function reaches its minimum. The minimum of the cost function may, for example, be calculated using the Matlab function "fmin-search". This function is based on the simplex algorithm. As can be seen, the distance to the fault is d=0.04 (d=39.86%).

A second exemplary embodiment for ground fault identification will be described in more detail in the following text.

The second exemplary embodiment uses the transient processes resulting from a ground fault, and calculates the complex vectors for the zero phase-sequence current and zero phase-sequence voltage for this transient process with an exponentially decaying envelope curve. The dominant natural frequency of the ground fault transient process in the zero phase-sequence voltage is used for this purpose. The ground fault direction is determined from the phase angle of these complex vectors of the zero phase-sequence current and zero phase-sequence voltage. Furthermore, the complex vectors determined in this way are transmitted via a communication device to the protective device which protects the other end of the line to be monitored. This can be done using IP-based network technology, which sets up a link briefly to the other substation only when required, and ends this again after a defined time.

The complex vectors at the two line ends are synchronized to a common timebase by means of pre-fault data or by identification of the time at which the fault started, by means of a signal model for the signals in the faulty state. The percentage distance to the ground fault location from one line end to the other is calculated from the complex vectors of the zero phase-sequence variables by solving the network equations shown in FIG. 5. This solution can be implemented directly or using an algorithm that is known per se for non-linear optimization.

The line data relating to the zero phase-sequence system that is required to solve the network equations is initially set using an estimated value of the line data, and is automatically measured in the event of an external ground fault, and is stored for later use. The network equation of the zero phase-sequence system can also be solved using the 50 Hz vectors of the zero phase-sequence system variables.

When the zero phase-sequence voltage rises above a selectable threshold value, a trigger signal is produced in each field device and triggers recording of the zero phase-sequence current and zero phase-sequence voltage of the outgoer connected to the field device. From this time on, a data window is selected, and the signal spectrum of the zero phase-sequence voltage is determined by means of an FFT.

The frequency of the dominant harmonic is determined by determining the axis of symmetry of the maximum value of the dominant harmonic in the spectrum.

The harmonic component of the transient process is separated from the fundamental frequency by high-pass filtering, and the root mean square value of the harmonic component is determined. The decay time constant of the harmonic component is determined by coefficient comparison or by means of a least-squares estimation method from the filtered root mean square value signal.

The complex vector of the transient process is calculated by means of a least-squares estimator using the signal parameters, which are now known, of the transient frequency and the decay time constant of the envelope curve.

The absolute time when the fault occurred and the complex vector of the transient process are transmitted in both directions to the appliance at the other end of the line.

If the direction indication is the same at both ends of the line, the fault location is calculated using the method already described in conjunction with FIGS. 1 to 14.

If the direction indication is different, the four-pole network parameters of the zero phase-sequence system are calculated, and are stored for use in the event of a ground fault on that specific line.

The line affected by the ground fault can also be determined by transformers which are not specifically adjusted, by determining the complex vectors of the transient process. This means that the measurement accuracy of the transformers used is subject to very minor requirements.

The invention claimed is:

1. A method for producing a fault signal identifying a location of a ground fault on a line between two line ends, which comprises the steps of:
    measuring a voltage and a current at each of the two line ends, with measured values being formed;
    determining a harmonic component contained in one of a zero phase-sequence voltage and a zero phase-sequence current, as well as a decay time constant for each of the two line ends, using the measured values;
    forming a magnitude and a phase of a harmonic vector measurement variable in each case using the harmonic component and the decay time constant for each of the two line ends, wherein a time reference point of the phase of the harmonic vector measurement variable relates to a time of the ground fault detection at a respective line end;
    rotating the harmonic vector measurement variables formed in this way, starting from the respective line end, to a time in a past;
    determining the time in the past and a location on the line at which rotated-back harmonic vector measurement variables have at least approximately a same magnitude and at least approximately a same phase, and the location on the line determined is regarded as the location of the ground fault; and
    outputting the location with a fault signal.

2. The method according to claim 1, which further comprises:
    taking account of a telegraph equation, which describes a propagation of electromagnetic waves on the line, by calculating a first and a second zero phase-sequence voltage vector for a selectable location on the line, for a time which is located in the past corresponding to a propagation time to the selectable location, using the harmonic vector measurement variables of the zero phase-sequence current and the zero phase-sequence voltage at the two line ends, wherein a first zero phase-sequence voltage vector is calculated starting from a first line end in a direction of a second line end, and a second zero phase-sequence voltage vector is calculated starting from the second line end in the direction of the first line end;
    comparing the first and second zero phase-sequence voltage vectors calculated in this way with one another; and
    selecting a line location at which calculated zero phase-sequence voltage vectors best match, and the line location determined in this way is regarded as the location of the ground fault.

3. The method according to claim 1, which further comprises:
    determining the magnitude and the phase of the two harmonic vector measurement variables by means of an estimation method on a basis of a predetermined signal model, which models a time profile of the zero phase-sequence voltage in a case of the ground fault, wherein the predetermined signal model takes account at least of the harmonic vector measurement variable to be determined at a defined vector angular frequency, a determined decay time constant of the harmonic component and a zero phase-sequence voltage vector measurement variable at a fundamental frequency of the zero phase-sequence voltage; and
    during a course of the estimation method, adapting the magnitude and the phase of the harmonic vector measurement variable such that a discrepancy between a time signal profile of a modeled signal of the signal model and a measured time signal profile of the measured values of the zero phase-sequence voltage is a minimum.

4. The method according to claim 3, which further comprises selecting the estimation method from the group consisting of a least squares estimation method, a Kalman filter algorithm and an ARMAX estimation method.

5. The method according to claim 1, which further comprises:
    selecting a frequency which is dominant for the harmonic component from a frequency spectrum of the harmonic component; and
    defining a vector angular frequency of the two harmonic vector measurement variables in each case such that it corresponds to the dominant frequency.

6. The method according to claim 1, which further comprises:
    determining a harmonic frequency whose amplitude is a maximum in the harmonic component; and
    defining a vector angular frequency of the two harmonic vector measurement variables in each case such that it corresponds to the harmonic frequency.

7. The method according to claim 1, which further comprises determining a time window for data used to generate the harmonic vector measurement variables such that a time window start is fixed at a start of a rise of the zero phase-sequence voltage after a predetermined threshold value has been exceeded.

8. The method according to claim 1, wherein the harmonic component is determined such that a measurement window for which a frequency spectrum of the zero phase-sequence voltage is determined by means of a Fourier transformation is in each case opened for each line end after a detection of the ground fault, and the frequency spectrum is subjected to high-pass filtering, in which harmonics of a fundamental frequency of the zero phase-sequence voltage are separated, forming the harmonic component.

9. The method according to claim 1, wherein the decay time constant is determined such that a root mean square value of the harmonic component is determined and the decay time constant of the root mean square value is determined, and the determined decay time constant of the root mean square value is regarded as the decay time constant of the harmonic component.

10. The method according to claim 1, which further comprises carrying out a measurement of the voltage at the two line ends free of synchronization, and the voltage measured values at the two line ends are unsynchronized.

11. A configuration for producing a fault signal that identifies a location of a ground fault on a line between a first and a second line end, the configuration comprising:
   a first measurement instrument at the first line end of the line for measuring a voltage and a current at the first line end resulting in measured values;
   a second measurement instrument at the second line end of the line for measuring a voltage and a current at the second line end resulting in measured values; and
   an evaluation device connected to said first and second measurement instruments and uses the measured values from said first and second measurement instruments, said evaluation device programmed to:
      determine a harmonic component contained in one of a zero phase-sequence voltage and a zero phase-sequence current, as well as a decay time constant for each of the first and second line ends, using the measured values;
      form a magnitude and a phase of a harmonic vector measurement variable in each case using the harmonic component and the decay time constant for each of the first and second line ends, wherein a time reference point of a phase of the harmonic vector measurement variable relates to a time of the ground fault detection at a respective line end;
      rotate the harmonic vector measurement variables formed in this way, starting from a respective line end, to a time in a past;
      determine the time in the past and a location on the line at which a rotated-back harmonic vector measurement variables have at least approximately a same magnitude and at least approximately a same phase, and the location on the line determined is regarded as the location of the ground fault; and
      output the location with a fault signal.

12. The configuration according to claim 11, wherein said evaluation device is formed by a programmed data processing installation.

13. The configuration according to claim 11, further comprising a central device, said evaluation device is disposed in said central device to which said first and second measurement instruments are connected.

14. The configuration according to claim 11, wherein said first and second measurement instruments are connected to one another and said evaluation device is implemented in one of said first and second measurement instruments.

15. A field device for connection to one line end of an electrical line and for identification of a ground fault on the line, the field device comprising:
   an evaluation device programmed to:
      determine a harmonic component contained in one of a zero phase-sequence voltage and a zero phase-sequence current, as well as a decay time constant for each of first and second line ends, using measured values;
      form a magnitude and phase of a harmonic vector measurement variable in each case using the harmonic component and the decay time constant for each the first and second line ends, wherein a time reference point of a phase of the harmonic vector measurement variable relates to a time of ground fault detection at a respective line end;
      rotate the harmonic vector measurement variables formed in this way, starting from the respective line end, to a time in a past;
      determine the time in the past and a location on the line at which a rotated-back harmonic vector measurement variables have at least approximately a same magnitude and at least approximately a same phase, and the location on the line determined is regarded as the location of the ground fault; and
      output the location with a fault signal; and
   a data connection for connection to another measurement instrument for receiving measured values which relate to another line end of the line.

16. The field device according to claim 15, wherein the field device is a protective device for connection to the one line end of the electrical line.

* * * * *